US006661034B2

United States Patent
Kawase

(10) Patent No.: US 6,661,034 B2
(45) Date of Patent: Dec. 9, 2003

(54) ORGANIC LIGHT EMITTING DEVICE WITH CORRUGATED LIGHT EMITTING LAYER

(75) Inventor: Takeo Kawase, Cambridge (GB)

(73) Assignees: Seiko Epson Corporation, Tokyo (JP); Cambridge University Technical Services Limited of the Old Schools, Cambridge (GB)

(*) Notice: Subject to any disclaimer, the term of this patent is extended or adjusted under 35 U.S.C. 154(b) by 104 days.

(21) Appl. No.: 09/832,974

(22) Filed: Apr. 12, 2001

(65) Prior Publication Data
US 2001/0038102 A1 Nov. 8, 2001

(30) Foreign Application Priority Data
Apr. 14, 2000 (GB) ............................................. 0009369

(51) Int. Cl.[7] .............................................. H01L 33/00
(52) U.S. Cl. ......................................... 257/103; 257/40
(58) Field of Search ..................... 257/40, 103, 51.022

(56) References Cited

U.S. PATENT DOCUMENTS

| | | | | |
|---|---|---|---|---|
| 4,658,402 A | | 4/1987 | Kobayashi | 372/50 |
| 5,732,102 A | * | 3/1998 | Bouadma | 372/96 |
| 5,881,089 A | * | 3/1999 | Berggren et al. | 372/96 |
| 6,252,253 B1 | * | 6/2001 | Bao et al. | 257/89 |

FOREIGN PATENT DOCUMENTS

| | | |
|---|---|---|
| EP | 0 878 883 A1 | 11/1998 |
| JP | 10-229243 | 8/1998 |

OTHER PUBLICATIONS

Samuel et al., Modification of light–emission from a polymer by wavelength–scale microstructure, *European Quantum Elec. Conf.*, (Sep. 1998), 160.*

Kawase et al., Low voltage operation of polymer light–emitting device with conducting polymer distributed Bragg reflector, *Mat. Res. Soc. Symp. Proc.*, 598 (2000) 11.49.1.*

Samuel et al., Control of light output from planar optical devices using wavelength–scale microstructure, *Intern. Quantum Elec. Conf.*, (Sep. 2000) 85.*

Gifford et al., Extraordinary transmission of organic photoluminescence through an otherwise opaque metal layer via surface plasmon cross coupling, *Appl. Phys. Lett.*, 80 (2002) 3679.*

"Effect of Lateral Microstructure on Conjugated Polymer Luminescence", B. J. Matterson et al., *Synthetic Metals*, 101, pp. 250–251 (1999).

"A Flexible Conjugated Polymer Laser", Christian Kallinger et al., *Advanced Matter*, 10, No. 12, 1998.

* cited by examiner

Primary Examiner—Michael S. Lebentritt
Assistant Examiner—Christian D. Wilson
(74) Attorney, Agent, or Firm—Oliff & Berridge, PLC

(57) ABSTRACT

A light emitting device formed of a substrate having first and second regions, a first non-transparent electrode formed on the substrate in the first region, a layer of organic light emitting material provided over the first non-transparent electrode in the first region, a layer of organic light emitting material provided over the substrate in the second region, the light emitting materials each having at least one planar surface which is corrugated, a second non-transparent electrode formed over the light emitting material in the first region, and a mirror formed over the light emitting material in the second region. A device having a stacked structure of electrodes and light emitting layers is also disclosed, as are various methods of fabricating the devices.

25 Claims, 6 Drawing Sheets a)

b)

c)

d)

a)

b)

c)

d)

a)

b)

c)

d)

ORGANIC LIGHT EMITTING DEVICE WITH CORRUGATED LIGHT EMITTING LAYER

The present invention relates to light emitting devices particularly those having a structure comprising a layer of organic light emitting material arranged on a substrate.

Conventional light emitting devices having a structure comprising a layer of organic light emitting material arranged on a substrate invariably comprise a substrate, a transparent electrode, a layer of organic light emitting material and a second electrode, arranged in that order. In such light emitting devices, holes are injected into the light emitting material from one electrode (usually the transparent electrode) and electrons are injected from the other electrode. Electron-hole recombination in the light emitting, or active, material generates light. The generated light is emitted from the device through the transparent electrode and substrate. These conventional devices have low efficiency, and provide a rather general spectrum output of relatively low intensity. Although not desirable, these characteristics can be tolerated in some applications but are fatal in applications such as optical communications.

It is an object of the present invention to provide a light emitting device having a structure comprising a layer of organic light emitting material arranged on a substrate, in which the above mentioned disadvantages are mitigated.

According to a first aspect of the present invention there is provided a light emitting device comprising a substrate having first and second regions, a first non-transparent electrode formed on the substrate in the first region, a layer of organic light emitting material provided over the first non-transparent electrode in the first region, a layer of organic light emitting material provided over the substrate in the second region, the light emitting materials each having at least one planar surface which is corrugated, a second non-transparent electrode formed over the light emitting material in the first region, and a mirror formed over the light emitting material in the second region.

According to a second aspect of the present invention there is provided a light emitting device comprising: a substrate having first and second regions; a first, non-transparent, electrode formed on the substrate in the first region; a first layer of organic light emitting material provided over the first electrode in the first region; a first layer of organic light emitting material provided over the substrate in the second region; the first layers of light emitting material each having at least one planar surface which is corrugated; a second electrode formed over the first layer of light emitting material in the first region; a layer of electrically insulating material formed over the second electrode in the first region; a layer of transparent material formed over the first layer of light emitting material in the second region; a third electrode formed over the electrically insulating material in the first region; a second layer of organic light emitting material provided over the third electrode in the first region; a second layer of organic light emitting material provided over the layer of transparent material in the second region; the second layers of light emitting material each having at least one planar surface which is corrugated; a fourth, non-transparent electrode formed over the second layer of light emitting material in the first region; and a mirror formed over the second layer of light emitting material in the second region.

According to a third aspect of the present invention there is provided a method of manufacturing a light emitting device comprising the steps of providing a substrate having first and second regions, providing a first non-transparent electrode on the substrate in the first region, providing a layer of organic light emitting material over the first non-transparent electrode in the first region, providing a layer of organic light emitting material over the substrate in the second region, providing each of the light emitting materials with at least one planar surface which is corrugated, providing a second non-transparent electrode over the light emitting material in the first region, and providing a mirror over the light emitting material in the second region.

According to a fourth aspect of the present invention there is provided a method of manufacturing a light emitting device comprising the steps of: providing a substrate having first and second regions; providing a first, non-transparent, electrode on the substrate in the first region; providing a first layer of organic light emitting material over the first electrode in the first region; providing a first layer of organic light emitting material over the substrate in the second region; providing each of the first layers of light emitting material with at least one planar surface which is corrugated; providing a second electrode over the first layer of light emitting material in the first region; providing a layer of electrically insulating material over the second electrode in the first region; providing a layer of transparent material over the first layer of light emitting material in the second region; providing a third electrode over the electrically insulating material in the first region; providing a second layer of organic light emitting material over the third electrode in the first region; providing a second layer of organic light emitting material over the layer of transparent material in the second region; providing each of the second layers of light emitting material with at least one planar surface which is corrugated; providing a fourth, non-transparent, electrode over the second layer of light emitting material in the first region; and providing a mirror over the second layer of light emitting material in the second region.

In stark contrast to the conventional arrangements the present invention provides a light emitting device in which an active layer provided on a substrate is sandwiched between two non-transparent electrodes.

It is understood that proposals have been made for the use of corrugated surfaces within certain electronically pumped laser devices. However, such devices have a fundamentally different structure and mode of operation compared with the light emitting devices to which the present invention applies. Moreover, the previous proposals have been of a mainly theoretical nature and have postulated devices which would be extremely difficult, if not impossible, to fabricate in practice.

Embodiments of the present invention will now be described by way of further example only and with reference to the accompanying drawings, in which.

Figure 8:
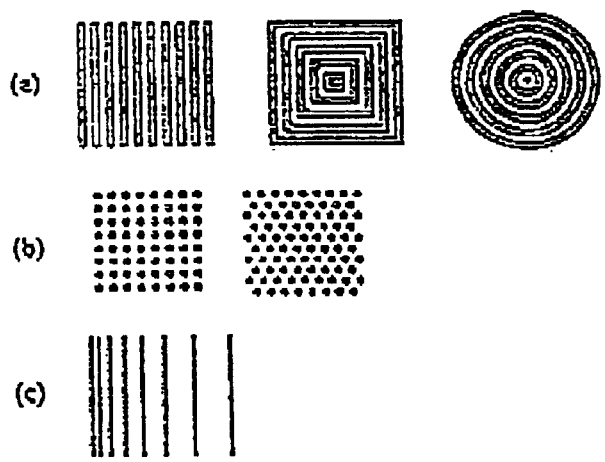
Figure 9:
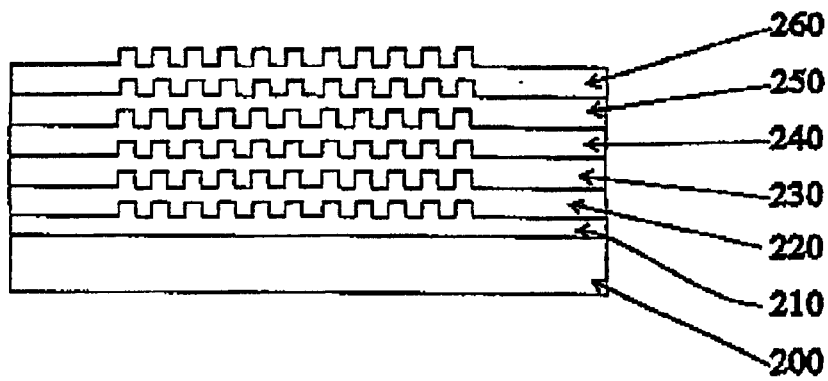

FIG. 8 illustrates various periodic structures which can be adopted in implementing the present invention; and FIG. 9 illustrates a preferred structure for achieving low absorption in the waveguide The conventional light emitting devices having a structure including an active, light emitting, material sandwiched between two electrodes operate on the basis of light generated in the active material being emitted perpendicularly to the planar layer of active material, through the transparent electrode and substrate. It has been found that the layer of active material acts as a waveguide and a substantial portion of the generated light can be trapped in waveguide modes within the active material. The higher the refractive index of the active, light emitting material, the larger the proportion of the generated light which is trapped in waveguide modes in the light emitting material. This consideration is of particular significance with the use of organic materials for the light emitting layer, especially if conjugated polymers are uses as the active material. This is because organic materials, especially conjugated polymers, have a high refractive index around the wavelength of the light emitted from the organic materials. It is believed that it is this mechanism which causes the low efficiency and low output intensity of the conventional devices.

As already noted, in stark contrast to the conventional arrangements the present invention provides a light emitting device in which an active layer provided on a substrate is sandwiched between two non-transparent electrodes (in the first region of the substrate). In the present invention, at least one planar surface of the layer of active material between the two electrodes is corrugated, so as to couple the radiative (ie the conventional device output, perpendicular to the layer of active material, substrate etc) and waveguide (trapped) modes of light propagation within the active material. A high proportion of the generated light is thus propagated in waveguide modes to the second region of the substrate.

Preferably, the active material extends across the first and second regions of the substrate in a contiguous, although not necessarily co-planar, fashion. The essential point is that light from the active material in the first region enters the active material in the second region. The active material in the second region also has at least one corrugated surface. Again the function of the corrugated surface is to couple the radiative and waveguide modes. In the second region light in waveguide modes from the active material in the first region couples to radiative modes, by which light is output from the device in the second region of the substrate. The size of the second region (the effective output aperture) of the device can be made relatively small compared with the light generation region (the first region) and thus the output intensity can be substantially increased.

The mechanism of the present invention is not one of simply shifting laterally the output of the device. Most importantly the propagation mode coupling caused by the corrugated surfaces results in wavelength selectivity (sharp peak output; very good colour purity) and dramatically increases the percentage of the generated light output by the device, thus substantially increasing output intensity. Devices according to the present invention can thus be suitable for application in optical communication systems, optical disks, printers, and the like. Moreover, as will be explained below, devices according to the present invention can be fabricated with relative ease and are suitable for mass production.

Figure 1:
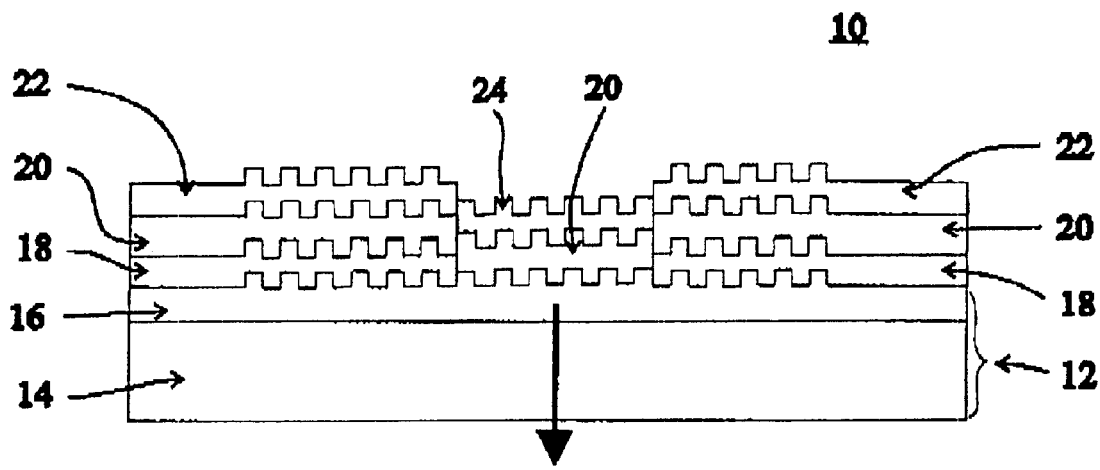
FIG. 1 is a schematic sectional view of a first embodiment of a light emitting device according to the present invention.

A first embodiment of the invention in accordance with the preceding description will now be exemplified with reference to FIG. 1 hereof.

As shown in FIG. 1, the device 10 comprises: a substrate 12, a first non-transparent electrode 18, an active material 20, a second non-transparent electrode 22, and a non-transparent mirror layer 24. The substrate 12 comprises a base 14, for example formed of glass, and a transparent resin layer 16. The resin layer 16 is provided so as to facilitate fabrication of the corrugated surfaces of the active material 20 (directly and via the electrode 18), as explained in more detail below.

The electrode 22, which is the cathode, is fabricated from a material having a low work function, such as Al, Ca etc. Electrode 18 is the anode and is selected from a material such as Ag, Cu, Fe etc.

In use, a voltage is applied to drive the display device. Typically the voltage will be in the range 2 V to 10 V. A positive voltage is applied to the anode and the cathode can be connected to ground.

Selection of the pitch of the corrugated surfaces of the active material is important and is explained in detail below. It should be mentioned that the preferred arrangement is for the pitch of the corrugated surface in the second region of the substrate to be twice the pitch of the corrugated surface in the first region of the substrate.

Figure 2:
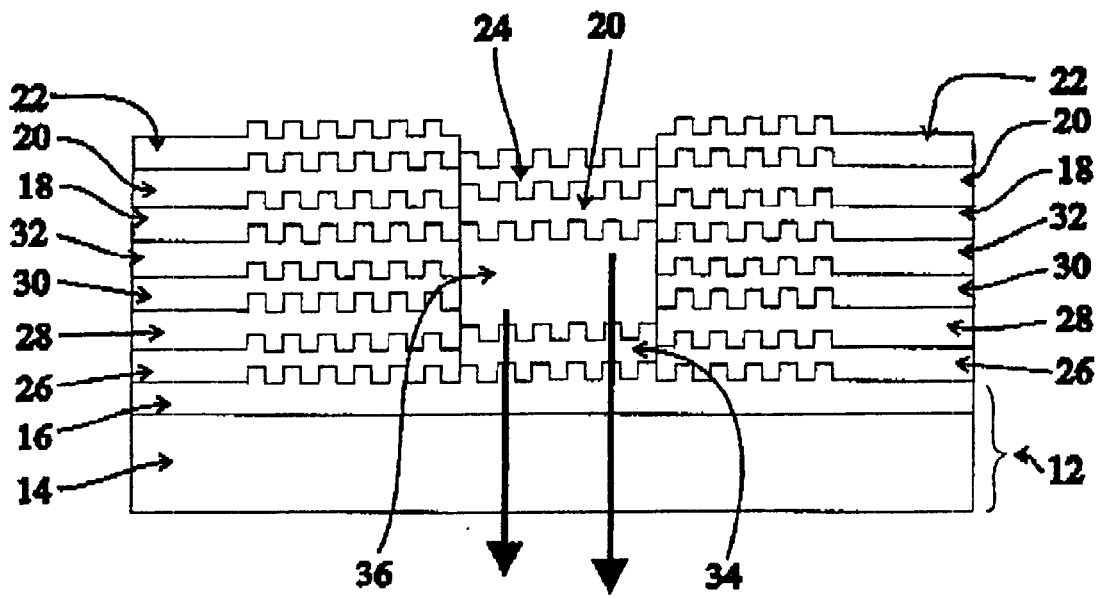
FIG. 2 is a schematic sectional view of a second embodiment of a light emitting device according to the present invention.

A second embodiment of the invention is illustrated in FIG. 2. The second embodiment demonstrates the concept of stacking light generating layers. For ease of description the reference numerals used in FIG. 1 are used in FIG. 2 to denote the top layer of a stacked layer device. FIG. 2 essentially illustrates a double stack device in which a second stack is fabricated between the substrate and the electrode/active material layers illustrated in FIG. 1. In the first region of the substrate, the second stack comprises: a non-transparent anode 26, a layer of active material 28 and a non-transparent cathode 30. A layer of electrically insulating material 32 is provided between the cathode 30 of the second stack and anode 18 of the first stack. In the second region, the second stack comprises an active material 34. As illustrated the second stack does not include a mirror layer, because this would block emission from the first stack in the second region. The transparent material 36 in the second region, between the active material 34 and the active material 20, has a thickness larger than that of the electrodes and the layers of active materials, so as to provide the correct positioning of active material 20 in the first and second regions.

The anode provides hole injection and the cathode provides electron injection. Thus different materials are required for these two electrodes. The anode should be a high work function material (typically of about 5 eV) and materials such as gold, platinum, or copper may be used. The cathode material should have a low work function and materials such as Li, Ca, Na, Mg, Al, Nd, Sm and Ga may be used.

FIGS. 1 and 2 are schematic sectional views and it will therefore be apparent that the so-called second region of the substrate, ie that containing the mirror 24, may be surrounded by the so-called first region of the substrate (i.e. that containing the non-transparent electrodes 18 and 22). Of course, many variations of the precise layout are possible and the description herein is concerned primarily with the man structure and function of the first and second regions.

The embodiment illustrated in FIG. 2 can be used simply to increase power density. It can also be used so as to output several distinct wavelengths from a single pixel. Thus, different active materials and different corrugation structures (particularly with respect to pitch) can be used in the different stacks. The ordering of the stacks would normally be wavelength dependent.

The present invention provides light emitting devices in which the active layer has a corrugated surface. The pitch of the corrugations, and to a lesser extent their amplitude, affects the performance of the device, as will be described below. There are, however, four areas of particular note with respect to practicable embodiments of the present invention. These are: the fabrication process, optical loss in the active layer, the pitch of the corrugations and the periodic structure of the corrugations. Each of these four areas of particular note is discussed below and then a number of specific examples are described.

Fabrication Process

It is an advantage of the present invention that many different fabrication processes are suitable for use in manufacturing light emitting devices according to the invention.

Figure 3:
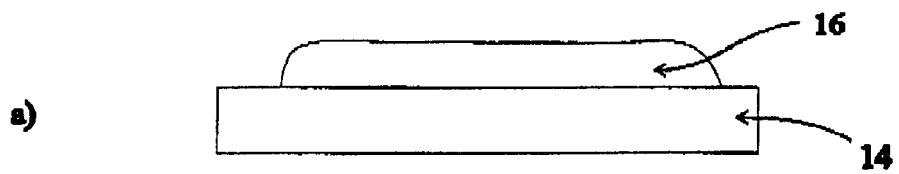
FIG. 3 illustrates a method of forming a substrate for use in a light emitting device according to the present invention.
Figure 3:
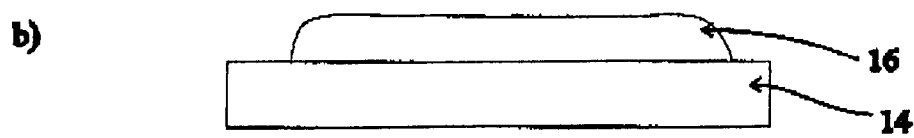
Figure 3:
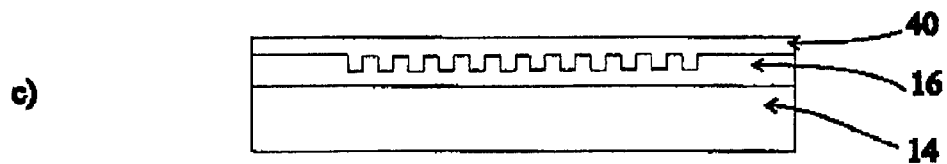
Figure 3:
Figure 3:
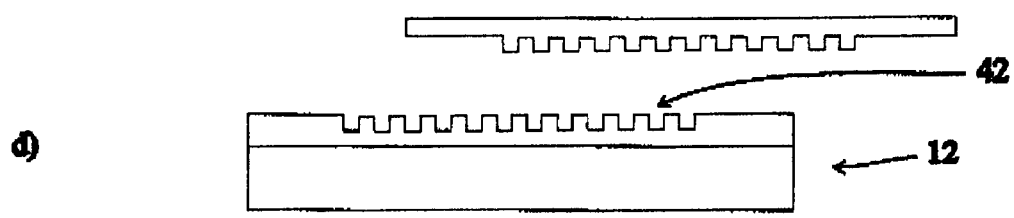

A method of forming a substrate for use in a light emitting device according to the present invention is illustrated in FIG. 3. In this arrangement, the substrate 12 comprises two components namely a transparent base 14 and a photo-polymerisation resin 16. As indicated in FIG. 3a, the photo-polymerisation resin 16 is applied to the upper surface of the base material 14. As indicated in FIG. 3b, the photo-polymerisation resin 16 covers an area at least as large as the area of a corrugated portion of a stamping mold 40. The stamping mold is pressed into the photo-polymerisation resin 16, which has the effect of flattening the photo-polymerisation resin 16 into a layer of uniform thickness (excess resin flows out from the edge). This procedure is preferably performed in a vacuum, so as to prevent bubble formation in the resin layer. As indicated in FIG. 3c, UV radiation is applied through the transparent base 14 so as to cure the resin 16. After the resin has been cured, the stamping mold is removed to leave the finished substrate 12 having a corrugated upper surface 42. The corrugated surface is used to form a corrugated active layer. The method is particularly suited to mass production.

The conductive polymer layer is formed by spin coating from solution. The surface of the conductive polymer layer also has corrugations. It is not exactly the same as the corrugation on the photo-polymerisation layer, but is slightly shallower and rounder. Instead of the conductive polymer layer, a hole-transporting layer is also applicable. Spin-coating is suitable for a polymer-type hole-transporting layer, evaporation is suitable for a small molecule type hole-transporting layer. For the light emitting layer, spin coating or evaporation is used depending on the type (polymer type or small molecule type). The cathode is formed by evaporation of metals.

An alternative to use of a substrate formed according to the method of FIG. 3 is to use an arrangement of a transparent substrate having a first electrode formed thereon with a conductive polymer film formed on the electrode, wherein the conductive polymer has a corrugated surface. A method of forming such an alternative component is illustrated in FIG. 4.

Figure 4:
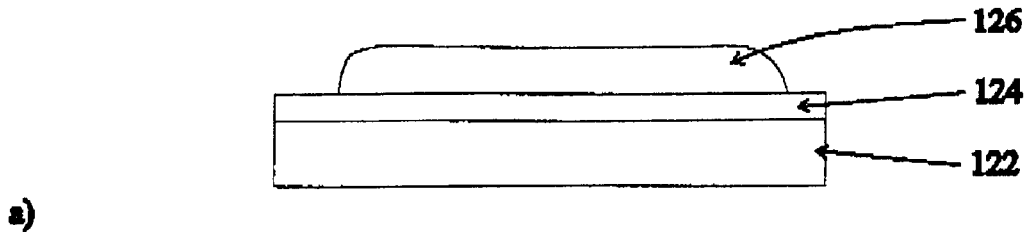
FIG. 4 illustrates another method of forming a substrate for use in a light emitting device according to the present invention.
Figure 4:
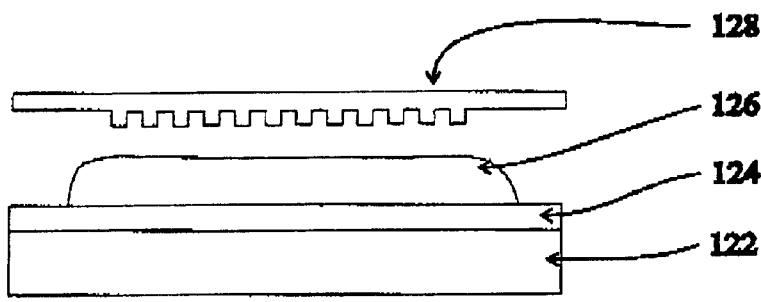
Figure 4:
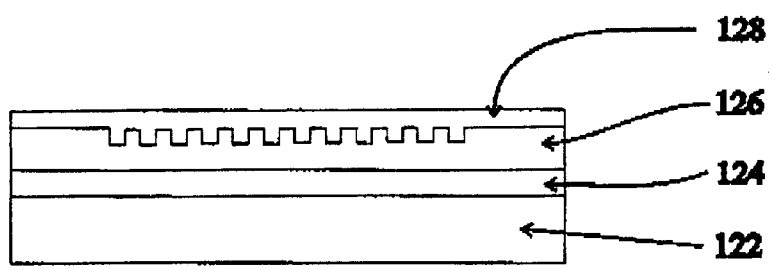
Figure 4:
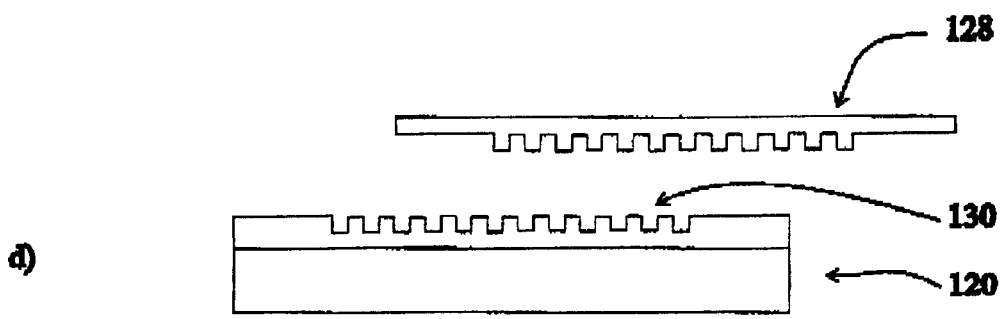

In FIG. 4, a component 120 is formed by providing a transparent substrate 122 having a first electrode 124 thereon. A solution 126 of conjugated polymer embedded in a transparent polymer matrix is then applied to the upper surface of the electrode 124, as illustrated in FIG. 4a. As indicated in FIG. 4b, the solution 126 covers an area at least as large as the area of a corrugated portion of a stamping mold 128. The stamping mold is pressed firmly into the solution 126, which has the effect of flattening the solution into a layer of uniform thickness. The arrangement is then heated so as to dry and fix the solid content in the solution 126. After the solid content has been fixed, the stamping mold is removed to leave the finished component 120 having a corrugated upper surface 130.

It will be appreciated that whereas a metal (eg nickel) stamping mold can be used with the method of FIG. 3, the use of a metal stamping mold is not appropriate in the method of FIG. 4 wherein evaporation of solvent is required during the drying stage. Thus in the method of FIG. 4 use may be made of a polymer stamping mold which the solvent can penetrate. Further, the method of FIG. 4 may involve the use of vacuum drying.

Figure 5:
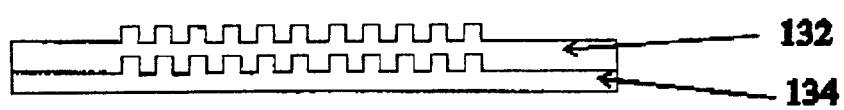
FIG. 5 illustrates a still further method of forming a substrate for use in a light emitting device according to the present invention.
Figure 5:
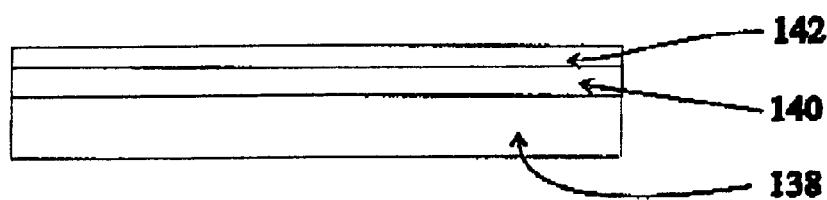
Figure 5:
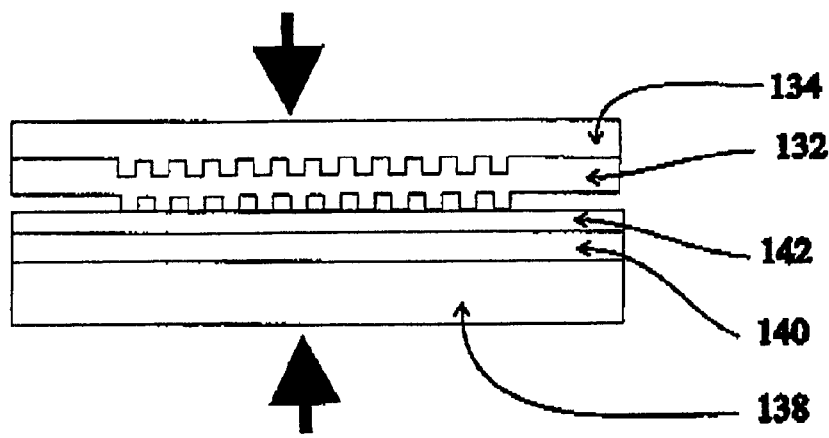
Figure 5:
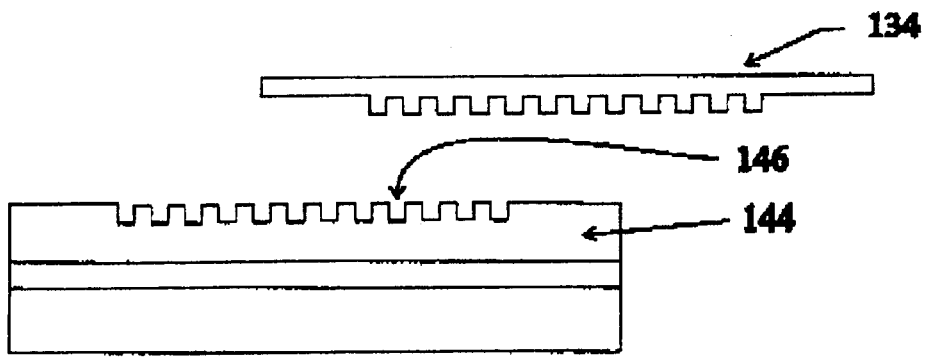

An alternative method of forming the component 120 is illustrated in FIG. 5. The method of FIG. 5 involves the formation of two components which are laminated into one component. Firstly a conductive polymer material 132 is applied by spin coating on to a stamping mold 134. As shown in FIG. 5a, the spin coated material 132 may have a conjugated upper surface which follows the corrugations of the stamping mold 134. A component consisting of a transparent substrate 138, an electrode 140 and a layer of conductive polymer 142 is separately formed, as illustrated in FIG. 5b. The spin coated stamping mold 134 is inverted and positioned on top of the other component, so that the polymers 132 and 142 are in contact with each other. As indicated in FIG. 5c, pressure (and possibly also heat) is applied so as to late the two components together. The polymers 132 and 142 combine to form a single layer 144. Polymers 132 and 142 do not have differences in their surface morphologies, but due to the plastic characteristics the polymers combine to form a single layer 144. Thereafter the stamping mold 134 is removed, as shown in FIG. 5d, so as to leave a single component having a transparent base 138, an electrode 140 formed thereon and a conductive polymer layer 144, formed on the electrode and presenting a corrugated upper surface 146.

Figure 6:
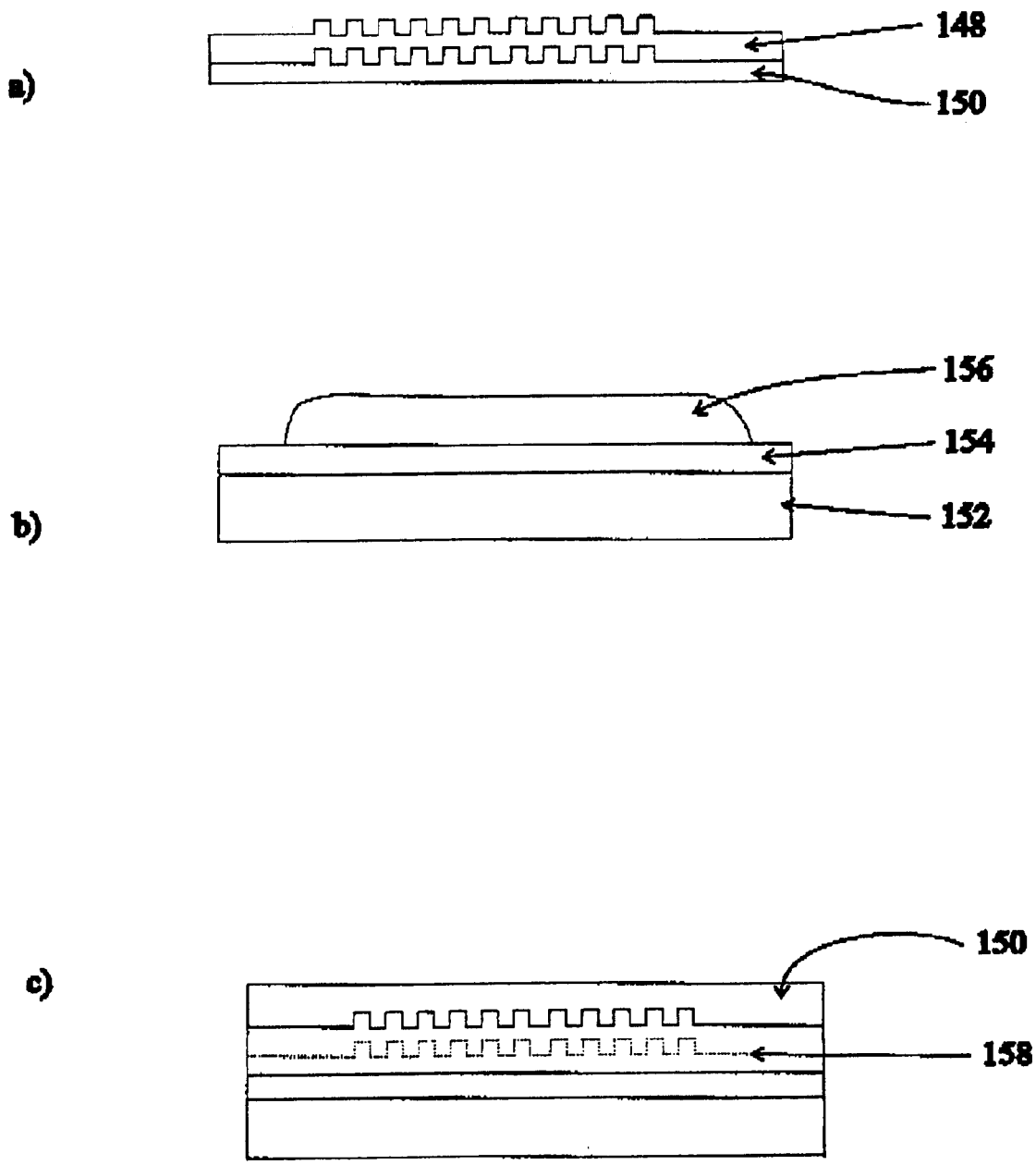
FIG. 6 illustrates yet another method of forming a substrate for use in a light emitting device according to the present invention.

A still further method of forming a desired component is illustrated in FIG. 6. This method employs a combination of the polymer solution method of FIG. 4 and the lamination method of FIG. 5. Specifically, a conductive polymer material 148 is applied by spin coating to a stamping mold 150, as indicated in FIG. 6a. Separately, a transparent substrate 152 having an electrode 154 thereon is prepared with a conductive polymer solution 156 applied on the surface of the electrode, as shown in FIG. 6b. Next, as shown in FIG. 6c, the spin coated mold 150 is inverted and pressed into the polymer solution 156. Heating is then applied so as to cause evaporation of the solvent and form a single layer 158 from polymers 148 and 156. Even if the polymer used is not plastic enough for the lamination process, this method can form a single layer having a corrugated surface. As before, removal of the mold leaves a single component having a transparent base, an electrode formed thereon and a conductive polymer layer formed on the electrode and presenting a corrugated upper surface.

As already noted, the basic function of the corrugated surface is to couple the waveguide propagation mode with the radiative mode. Within limits, the depth or amplitude of the corrugations controls the strength of the coupling between the modes, with a greater depth giving a higher coupling. Typically, the depth of the corrugations might be of the order of 50 nm—that is, similar to the depth of the active layer. Perhaps of more importance, however, is the period of the corrugations.

Period

Figure 7:
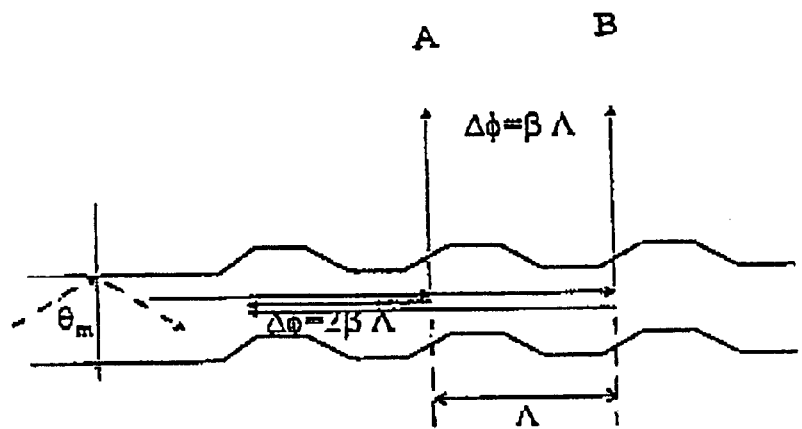
FIG. 7 illustrates various parameters associated with the pitch selection for the active layer.

FIG. 7 illustrates various parameters of the corrugated active layer which should be controlled. In this respect equations can be derived in terms of the various parameters, as follows. Specifically, the following description is given with respect to the second region of the substrate, but it is apparent that the coupling which occurs in the first region can be understood in similar terms.

The height (or depth) of the active layer is represented by h. Light propagating in a waveguide mode in the active layer is reflected from the upper and lower surfaces of the active layer, at an angle $\theta_m$ as indicated in FIG. 7 and where m is used to signify the mode number. On reflection from the surfaces there will be a phase change which is dependent upon the respective refractive index ratio between the active material and the material on either side thereof. These phase changes are denoted by the references $\phi_a$ and $\phi_b$, respectively for the upper and lower surfaces. Using $\lambda_o$ to indicate the desired output wavelength (in a vacuum), k to denote the propagation constant in a vacuum, $\beta$ to denote the propagation constant in the active material, $\Lambda$ to denote the pitch of the corrugations and n to denote an integer, the parameters are related by the equations:

$$2nhk\cos\theta_m - 2\phi_a - 2\phi_b = 2m\pi$$

$$\beta = nk\sin\theta_m$$

$$k = 2\pi/\lambda_o$$

Considering adjacent positions along the corrugated surface of the active layer, it will be apparent that a phase difference exists in the radiative emission from each of the adjacent positions. The radiative mode output will thus be enhanced by ensuring that output from positions separated by the corrugation pitch length are in phase. Thus, it should be arranged that the phase difference, $\Delta\phi$, along the active layer is equal to the product of the pitch of the corrugations, $\Lambda$, and the propagation constant, $\beta$, within the active layer. For example, the two points of radiative emission indicated by arrows A and B in FIG. 7 should be in phase with each other—which is arranged by ensuring that $\Delta\phi = \beta\Lambda$. Thus, for a strong radiative mode emission:

$$\Delta\phi = \beta\Lambda = 2\pi v \ (v=1, 2, 3 \ldots)$$

Hence:

$$\Lambda = v\lambda_o n \sin\theta_m$$

That is; the pitch required to achieve a strong emission in the radiative mode for wavelength $\lambda_o$ is a relatively simple function of the angle $\theta_m$, which angle is determined by the depth and refractive index of the active layer and the mode number of the waveguide propagation which is being coupled.

Periodic Structure

It might be understood from FIGS. 3 to 6 that the corrugated surfaces have the form of a simple diffraction grating, that is as shown in the first of the three examples of FIG. 8(*a*). Although this may be the case, it is not limiting and other periodic patterns may be used. Other forms of what might be considered a one-dimensional periodic structure are illustrated as the other two examples in FIG. 8(*a*). Further, it is possible to use what might be considered as two or three-dimensional periodic structures—for example having the formats indicated in FIG. 8(*b*). These are essentially photonic band gap structures. They stop propagation in certain directions at certain wavelengths. Of the two examples shown in FIG. 8(*b*), the off-set pattern (the second example) is considered the most effective since all inter-dot distances are set to be equal to $\Lambda$. A further alternative is to use a so-called chirping grating, an example of which is illustrated in FIG. 8(*c*). Usually the use of a grating results in a narrow spectrum. However, a chirping grating can be used when there is a requirement for high efficiency without the restriction of a narrow grating. This results in a broad spectrum. Efficiency is improved and emission from the device is more dependent upon the original emission properties of the material.

Optical Loss

In order to obtain a strong emission from a waveguide mode coupled with a radiation mode, it is necessary to minimise optical loss in the waveguide mode. The light in a waveguide travels very long distances compared to the light emitted directly in a radiation mode, even small absorption gives rise to attenuation of the field strength confined in the active layer, resulting in a small emission from a waveguide mode coupled with a radiation mode.

Considering light coming from a plane waveguide, which does not have a corrugated surface, and entering a corrugated waveguide; some part of the light is refracted in to the out-of-plane, and the other part is reflected within the waveguide. The intensities of the electric field become exponential. The intensity in the plain region is the sum of the incident light and the reflected light. The attenuation curve in the corrugated region can be described as $I = e^{-\gamma x}$, where $\gamma$ represents the coupling coefficient of the waveguide mode with the radiation made. The absorption in a waveguide is also described in the way namely, $I = e^{-\alpha x}$, where $\alpha$ is an absorption coefficient. In order to have a strong emission from the waveguide mode, the coupling coefficient $\gamma$ should be smaller than the absorption coefficient, preferably at least by a factor of ten.

The intrinsic absorption of active materials such as light emitting low molecules and light emitting corrugated polymers is low enough (eg less than 1000 cm$^{-1}$) in a transparent spectrum range compared to the coupling coefficient. Absorption in the waveguide mode arises from absorption in the active layer and also from absorption by the neighbouring layers. Absorption from the neighbouring layers arises since the energy of evanescent light existing in the neighbouring layers can be absorbed by the medium of the neighbouring layers. The cathode is made of metal, which has large absorption, so when the cathode is formed on the active layer, the absorption in the waveguide is determined by this metal. The order of the absorption is 1000 cm$^{-1}$, so the structure which has the cathode on the active layer can be used for this invention, but it is perhaps not ideal. An electron transforming cladding layer is preferably placed between the active layer and the cathode. The electron transforming cladding layer should be made of a material which has a high electron mobility and good matching of it's LUMO level to the work function of the cathode. In terms of the high mobility, a low molecular system might be more suitable for this purpose than conjugated polymers.

A preferred structure for achieving low absorption in the waveguide is illustrated in FIG. 9. The structure comprises a substrate 200 having a photo-polymerisation layer 210 thereon. The surface of the photo-polymerisation layer 210 opposite to that in contact with the substrate 200 is corrugated and a transparent electrode 220 is provided thereon. Next a conductive polymer layer or a hole transporting layer 230 is provided on the electrode 220 and then is located the light emitting layer 240. An electron transporting layer 250 is provided over the light emitting layer and at the top of the structure is an electrode 260. The corrugation of the layer 210 is followed by all of the subsequent layers, including the electrode 260. In this structure, the thickness of the electron transporting layer should be thicker than the penetration depth of evanescent light at the interface of the light emitting layer and the electron transporting layer.

Scattering in the active layer also increases optical loss. Scattered light could, however, be emitted from the device and thus scattering does not lower the efficiency. However, when the scattering is large, it is difficult to obtain the narrow spectrum output which should be expected from the device (according to the period of the corrugation pattern). Low molecular systems generally have a rough surface and many scattering points. Amorphous conjugated polymer is more suitable for the active layer because of it's low scattering characteristics.

Optical loss in the waveguide mode arises from absorption by the active layer and also from absorption by the neighbouring layers. Absorption by the neighbouring layers arises since reflection at the active layer boundaries is not reflection from a perfect surface but is in practice reflection across an interface depth. Further, domain ordering arises in the active layer, which is analogous to polycrystaline structures. That is, scattering occurs and this also causes optical loss in the waveguide mode.

The absorption coefficient, $\alpha$, of the active material is critical in reducing optical loss in the waveguide mode. Low molecular systems typically have absorption coefficients in the range of 500 $cm^{-1}$ to 1000 $cm^{-1}$.

The fabrication processes used with low molecular systems give rise to defects in the layer and a high degree of scattering results. In contrast polymer materials can be applied using ink-jet technology and low defect, low scattering active layers can thus be deposited.

The intensity of light loss in a material is dependent upon the absorption coefficient, $\alpha$, and distance, x, into the material in the following manner:

$$I = e^{-\alpha x}$$

Thus, a large absorption coefficient produces a sharp change in absorption with depth in to the material, eg within 10 $\mu m$. A layer thickness of 10 $\mu m$ does not produce a large coupling and thus 10 $\mu m$ can be considered to be a lower limit. An absorption coefficient of 100 $cm^{-1}$ results in a corresponding absorption depth of 100 $\mu m$, which is good enough to produce the desired coupling. Hence the use of a material such as a conjugated polymer is more desirable than the use of a low molecular system for the active layer. Further, there are of course many different polymer materials and some exhibit a polycrystaline type phase whereas others exhibit an amorphous phase. It is preferable to use an amorphous conjugated polymer for the active layer of a device according to the present invention. Polyflourine derivatives are particularly suitable materials which provide strong emission in a device according to the present invention.

Embodiments of the present invention preferably use light emitting materials which have an absorption coefficient of less than 1000 $cm^{-1}$, and more preferably of less than 500 $cm^{-1}$.

First Example

A first example is prepared essentially following the method of FIG. 3. The example uses a glass substrate and a epoxy-photo-polymerisation rest. An electroformed nickel stamper, patterned by photo-lithography, is used to produce the corrugated surface. Stampers having a one-dimensional periodic structure with pitch sizes of 300, 330, 360, 390 and 450 nm are used and the depth of the corrugations is set at 50 nm. The glass substrate is treated with a Silyl coupler to ensure sufficient adhesion of the resin layer. An electrode layer is deposited on the resin layer to a thickness of 120 nm. An active layer formed of F8BT, poly(9,9-dioctyylfluorene-co-2,1,3-benzothiadizole), is applied on to the electrode layer by spin coating. F8BT is an amorphous material presenting low optical loss. The active layer has a thickness of 140 nm and an absorption coefficient of less than 100 $cm^{-1}$. A metal electrode formed of Ca 100 nm/Al 300 nm is provided on the active layer by evaporation deposition,

Second Example

A second example is formed essentially following the method of FIG. 4. This example uses a glass substrate provided with a flat electrode layer. A conductive polymer layer is formed using a blend, in aqueous solution, of PEDOT poly-3,4-Ethlenedioxytiophene) and PSS poly-stylene-sulfonic acid) in the ratios 1:5–1:100. The PSS is essentially uses as a flexible matrix for the PEDOT material. PSS is a conventional polymer which is relatively easy to process for stamping and moulding. PEDOT is a conjugated polymer which is less easily processed than a non-conjugated polymer. It has a higher conductivity but a less plastic bulk property. The use of a thin layer reduces the importance of the conductivity and thus the use of diluted PEDOT can be acceptable.

A polymer stamper mould (formed using a nickel stamper) is used to corrugate the surface of the conductive polymer layer. That is, the polymer solution is applied over the electrode layer and the polymer stamper mould applied to the solution and left to dry at 80° C. for 24 hours. The mould is then removed and an active layer applied by spin coating. The active layer is formed of F8BT, poly(9,9-dioctyylfluorene-co-2,1,3-benzothiadizole) to a thickness of 140 nm. The absorption coefficient is less than 100 $cm^{-1}$. A metal electrode formed of Ca 100 nm/Al 300 nm is provided on the active layer by evaporation deposition.

A first modified version of the second example is made essentially using the method of FIG. 5. That is, the solution of conductive polymer is spin-coated on to a nickel stamper and on to the electrode layer. The two components thus formed are pressed together in a vacuum at 200° C. for 5 minutes and the nickel stamper is then pulled off.

A second modified version of the second example is made essentially using the method of FIG. 6. That is, the solution of conductive polymer is spin-coated on to a plastic mould and on to the electrode layer. The two components are joined together and dried at 80° C. in a vacuum for 24 hours. The plastic mould is then removed.

Third Example

A third example is made essentially following the method and materials used for the first example but in his case the stamper is embossed with an array of dots. That is, the periodic structures are of the types illustrated in FIG. 8(b). The third example exhibits highly directional output and the emission peaks can be as much as 2.5 times as high as those of the first example. Whereas the one-dimensional periodic structure of the first example generates a "line" output directivity, the two-dimensional periodic structure of the third example generates a "column" output directivity.

Fourth Example

A fourth example is made essentially following the method and materials used for the first example but in this case the stamper is embossed with a "chirping" grating. That is, the periodic structures are of the type illustrated in FIG. 8(c).

Fifth Example

The fifth example essentially follows the method and materials used for the first example but in this case the stamper provides gratings of different periods, or different design, on the same substrate. Thus each area having a respective one of the gratings each enhances a respective wavelength and the example thus provides multi-colour output. The high directivity of the outputs reduces the usefulness of the devices for display devices such as those conventionally implemented with Liquid Crystal Display panels. However, the high directivity of the output renders the devices particularly suitable for various other applications such a projection display apparatus.

What is claimed is:

1. A light emitting device comprising a substrate having first and second regions, a first non-transparent electrode formed on the substrate in the first region, a layer of organic light emitting material provided over the first non-transparent electrode in the first region, a layer of organic light emitting material provided over the substrate in the second region, the light emitting materials each having at least one planar surface which is corrugated, a second non-transparent electrode formed over the light emitting material in the first region, and a mirror formed over the light emitting material in the second region.

2. A light emitting device as claimed in claim 1, wherein the light emitting materials in the first and second regions are the same material.

3. A light emitting device as claimed in claim 1, wherein the second non-transparent electrode and the mirror are formed of the same material.

4. A light emitting device comprising: a substrate having first and second regions; a first, non-transparent, electrode formed on the substrate in the first region; a first layer of organic light emitting material provided over the first electrode in the first region; a first layer of organic light emitting material provided over the substrate in the second region; the first layers of light emitting material each having at least one planar surface which is corrugated; a second electrode formed over the first layer of light emitting material in the first region; a layer of electrically insulating material formed over the second electrode in the first region; a layer of transparent material formed over the first layer of light emitting material in the second region; a third electrode formed over the electrically insulating material in the first region; a second layer of organic light emitting material provided over the third electrode in the first region; a second layer of organic light emitting material provided over the layer of transparent material in the second region; the second layers of light emitting material each having at least one planar surface which is corrugated; a fourth, non-transparent, electrode formed over the second layer of light emitting material in the first region; and a mirror formed over the second layer of light emitting material in the second region.

5. A light emitting device as claimed in claim 4, wherein the first light emitting materials in the first and second regions are the same material.

6. A light emitting device as claimed in claim 4, wherein the second light emitting materials in the first and second regions are the same material.

7. A light emitting device as claimed in claim 4, wherein the fourth electrode and the mirror are formed of the same material.

8. A light emitting device as claimed in claim 1, wherein the substrate has a corrugated surface.

9. A light emitting device as claimed in claim 1, wherein a conductive polymer layer is formed over the first electrode, the conductive polymer layer having a corrugated surface opposite to a surface facing the first electrode, and the first light emitting material in the first region being in contact with said corrugated surface of the conductive polymer layer.

10. A light emitting device as claimed in claim 1, wherein the light emitting material has an absorption coefficient of less than 1000 cm$^{-1}$.

11. A light emitting device as claimed in claim 1, wherein the light emitting material comprises a conjugated polymer.

12. A light emitting device as claimed in claim 1, wherein the light emitting material comprises a ployflourine derivative.

13. A light emitting device as claimed in claim 1, wherein at least one of the corrugated surfaces has a pitch A according to the equation:

$$\Lambda = v\lambda_0/n \sin \theta_m$$

in which angle $\theta_m$ is the angle of reflection from the upper and lower surfaces of the layer of light emitting material of light propagating in a waveguide mode m in the light emitting material $\lambda_o$ is the output wavelength, and n and v are integers.

14. A light emitting device as claimed in claim 1, wherein the pitch of at least one of the corrugated surfaces is in the range 300 to 450 nm.

15. A light emitting device as claimed in claim 1, wherein at least one of the corrugated surfaces has a one-dimensional periodic structure.

16. A light emitting device as claimed in claim 1, wherein at least one of the corrugated surfaces has a two-dimensional periodic structure.

17. A light emitting device as claimed in claim 1, wherein at least one of the corrugated surfaces has a three-dimensional periodic structure.

18. A light emitting device as claimed in claim 1, wherein at least one of the corrugated surfaces has the structure of a chirping grating.

19. A method of manufacturing a light emitting device comprising the steps of providing a substrate having first and second regions, providing a first non-transparent electrode on the substrate in the flit region, providing a layer of organic legit emitting material over the first non-transparent electrode in the first region, providing a layer of organic light omitting material over the substrate in the second region, providing each of the light emitting materials with at least one planar surface which is corrugated, providing a second non-transparent electrode over the light emitting material in the first region, and providing a minor over the light emitting material in the second region.

20. A method of manufacturing a light emitting device as claimed in claim 19, wherein the step of arranging for the first light emitting material to have at least one corrugated surface includes providing a corrugated surface on the substrate.

21. A method of manufacturing a light emitting device as claimed in claim 20, comprising the steps of providing the substrate with a photo-setting resin, forming the corrugated surface on the substrate by shaping the resin using a mold and setting the resin by illuminating it with radiation.

22. A method of manufacturing light emitting device as claimed in claim 19, further comprising the step of forming a conductive polymer layer over the tint electrode and wherein the step of arranging for the first light emitting material in the first region to have at least one corrugated surface includes providing a corrugated surface on the conductive polymer layer.

23. A method of manufacturing a light emitting device as claimed in claim 22, comprising the steps of forming the corrugated surface on the conductive polymer layer by shaping the layer with a polymer mold and setting the layer by applying heat.

24. A method of manufacturing a light emitting device as claimed in claim 22, wherein the step of providing a corrugated surface on the conductive polymer layer comprises; spin coating a conductive polymer material on to the first electrode, spin coating a conducive polymer material onto the corrugated surface of a mold, positioning the spin coated mold on the conductive polymer layer provided on the first electrode so as to sandwich the two conductive polymer layers together and subsequently removing the mold.

25. A method of manufacturing a light emitting device comprising the steps of providing a substrate having first and second regions; providing a first, non-transparent, electrode on the substrate in the first region; providing a first layer of organic light emitting material over the first electrode in the first region; providing a first layer of organic light emitting material over the substrate in the second region; providing each of the first layers of light emitting material with at least one planar surface which is corrugated; providing a second electrode over the first layer of light emitting material in the first region; providing a layer of electrically insulating material over the second electrode in the first region; providing a layer of transparent material over the first layer of light emitting material in the second region; providing a third electrode over the electrically insulating material in the first region; providing a second layer of organic light emitting material over the third electrode in the first region; providing a second layer of organic light emitting material over the layer of transparent material in the second region; providing each of the second layers of light emitting material with at least one planar surface which is corrugated; providing a fourth, non-transparent, electrode over the second layer of light emitting material in the cast region; and providing a mirror over the second layer of light emitting material in the second region.

* * * * *